United States Patent

Kim et al.

Patent Number: 5,920,264
Date of Patent: Jul. 6, 1999

[54] COMPUTER SYSTEM PROTECTION DEVICE

[75] Inventors: Dong-Hwan Kim, Suwon; Noh-Byung Park, Seocho-gu; Kwang-Yeol Lee, Gwachon-shi, all of Rep. of Korea

[73] Assignee: Samsung Electronics Co., Ltd., Kyungki-Do, Rep. of Korea

[21] Appl. No.: 08/480,742

[22] Filed: Jun. 7, 1995

[30] Foreign Application Priority Data

Jun. 8, 1994 [KR] Rep. of Korea .................. 94-13219
Oct. 14, 1994 [KR] Rep. of Korea .................. 94-26360

[51] Int. Cl.⁶ ............................................ G08B 17/00
[52] U.S. Cl. .................... 340/584; 340/595; 340/679; 340/693.5; 340/693.9; 340/635; 361/695; 361/717; 364/166
[58] Field of Search ............................ 340/584, 595, 340/679, 693.5, 693.963, 5; 361/695, 696, 697, 717, 718, 719, 720; 363/141, 89; 257/712, 713, 722, 717; 364/116, 550, 488, 141; 374/141, 183; 327/512

[56] References Cited

U.S. PATENT DOCUMENTS

| | | | |
|---|---|---|---|
| 4,604,871 | 10/1995 | Chiu et al. | 340/588 |
| 4,812,733 | 3/1989 | Tobey | 364/432 |
| 5,189,314 | 2/1993 | Georgiou et al. | 307/271 |
| 5,287,292 | 2/1994 | Kenny et al. | 364/550 |
| 5,371,665 | 12/1994 | Quisenbery et al. | 363/89 |
| 5,422,806 | 6/1995 | Chen et al. | 364/166 |
| 5,453,644 | 9/1995 | Yap et al. | 340/523 |
| 5,457,342 | 10/1995 | Herbst, II | 357/712 |
| 5,477,417 | 12/1995 | Ohmori et al. | 361/695 |

*Primary Examiner*—Benjamin C. Lee
*Attorney, Agent, or Firm*—Pillsbury Madison & Sutro LLP

[57] ABSTRACT

A protection device for a micro-controller chip comprising a heat sink, a cooling fan, and an overheat alarm. The heat sink is adapted to be mounted on a micro-controller chip and is capable of dissipating heat generated by the micro-controller chip. The cooling fan disperses the heat dissipated by the heat sink into the surrounding atmosphere. The overheat alarm includes a temperature sensor, a voltage comparator, an oscillator, and alarm sound generator. The temperature sensor converts a temperature of the heat sink into electrical signals and outputs a voltage proportional to the temperature of the heat sink. A voltage comparator compares the voltage output from the temperature sensor with a reference voltage signal and outputs a comparator output voltage. The oscillator generates and outputs an oscillating voltage signal. The alarm sound generator is enabled by the comparator output voltage from the voltage comparator for generating an alarm sound by operating a speaker in accordance with the input oscillating voltage signal from the oscillator.

13 Claims, 6 Drawing Sheets

COMPUTER SYSTEM PROTECTION DEVICE

FIELD OF THE INVENTION

The present invention relates to a computer system protection device. Particularly, when a Micro-controller, CPU (Central Processing Unit), reaches a high temperature, the computer system protection device warns the user, or prevents the micro-controller from making an error by reducing a system clock.

DESCRIPTION OF THE RELATED ART

Recently, there has been a trend in the field of micro-controller electronics to increase the clock speed of the micro-controller, which is used as a CPU (Central Processing Unit) to elevate the performance of the computer system. Sometimes, when the clock speed increases, the micro-controller and the peripheral chips overheat. If such overheating occurs, the micro-controller can be damaged or make errors, and the working data and some information can become corrupted or lost. Therefore, to reduce the heat generated during the operation of the micro-controller, INTEL Co. equips the chip in their pentium processors and other pentium-level products such as pentium micro-controllers with a heat sink and a cooling fan. This prevents the micro-controller from overheating.

FIG. 1 is an exploded perspective view, which shows the construction of a conventional heat sink and cooling fan of a micro-controller.

FIG. 2 is an assembled perspective view, which shows the construction of the conventional heat sink and cooling fan of the micro-controller shown in FIG. 1.

FIG. 3 is a side view, which shows the construction of the conventional heat sink and cooling fan of the micro-controller shown in FIGS. 1 and 2.

As illustrated in FIGS. 1 to 3, the conventional heat sink and the cooling fan of the micro-controller comprise a micro-controller chip package (5), an aluminum heat sink (3) which is disposed on the micro-controller chip package (5), a metal clip (4) which attaches the micro-controller chip package (5) to the heat sink (3), a small-sized cooling fan (2) on the heat sink (3), and a screw (1) which screws the small sized cooling fan (2) to the heat sink (3).

A conventional heat sink and cooling fan of a micro-controller chip package operate as follows:

Heat is generated as the computer operates and is transmitted to the micro-controller. The heat is then emitted to the atmosphere by the surrounding air. A large amount of heat is transmitted to the heat sink (3), which helps to lower the temperature of the micro-controller chip package (5) through emission of heat to the atmosphere by the surrounding air. The cooling fan (2) helps the heat sink (3) to emit heat into the air easily, thereby enabling the temperature of micro-controller chip package (5) to be lowered.

However, conventional micro-controller chip packages with the heat sink and the cooling fan cannot completely protect the computer system because the heat sink (3) and its chip package cannot sufficiently remove heat from the micro-controller to prevent overheating when the small sized cooling fan is out of order. Currently, a user is responsible for recognizing such a failure.

Conventionally, when examining the causes of computer failure, we can classify the causes into three types: one is from the problems in the HDD (Hard Disk Drive) or FDD (Floppy Disk Drive), another is from the problems in the power supply system, and the last is from the problems caused by excessive heat. The failure rate of the conventional micro-controller chip package due to over-heating in the above-described systems is about 5%.

SUMMARY OF THE INVENTION

Therefore, the object of the present invention is to solve the problems of the conventional art and to provide an alarm to indicate the condition of overheating of the micro-controller chip package so as to protect the micro-controller chip package from overheating. The overheating alarm works such that when the temperature of the micro-controller chip package goes up a certain number of degrees, it generates an alarm and halts the computer.

To fulfill the above-mentioned object, one aspect of the present invention comprises a computer system protection device having a heat sink; a voltage comparator which compares the output voltage of a temperature sensor with the output voltage of a voltage regulator and which outputs a fixed voltage if the internal temperature of the system is below a predetermined temperature, and which outputs a voltage in proportion to the internal temperature if the voltage from the temperature sensor is above the predetermined temperature; a voltage-controlled oscillator outputs a frequency which is varied in proportion to the output voltage of the comparator; and a clock generator which outputs a clock speed that varies in proportion to the output frequency of the voltage-controlled oscillator.

DETAILED DESCRIPTION OF THE PREFERRED EMBODIMENTS

Figure 1:
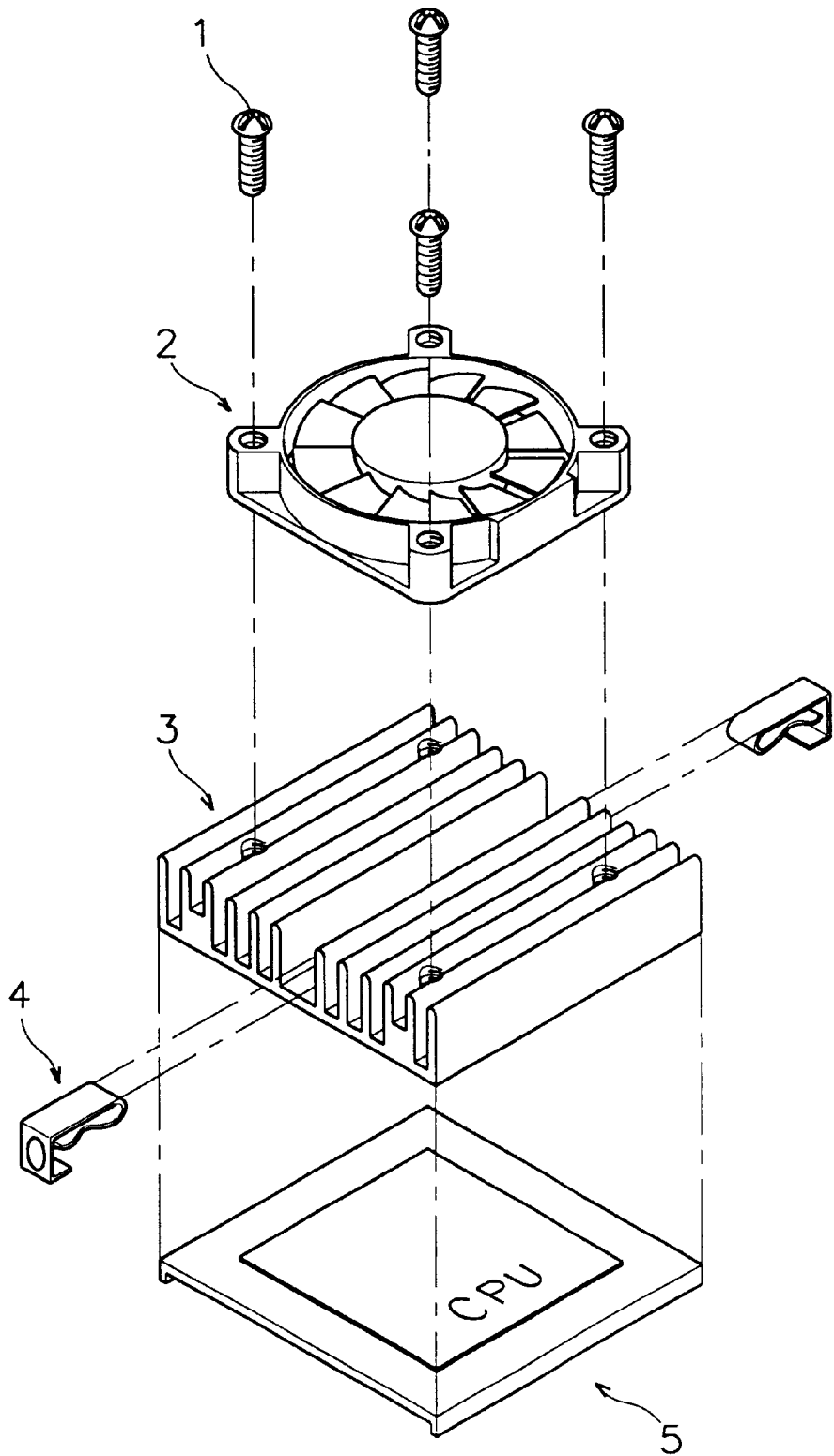
FIG. 1 is an exploded perspective view, which shows the construction of a conventional heat sink and a cooling fan of the micro-controller.
Figure 2:
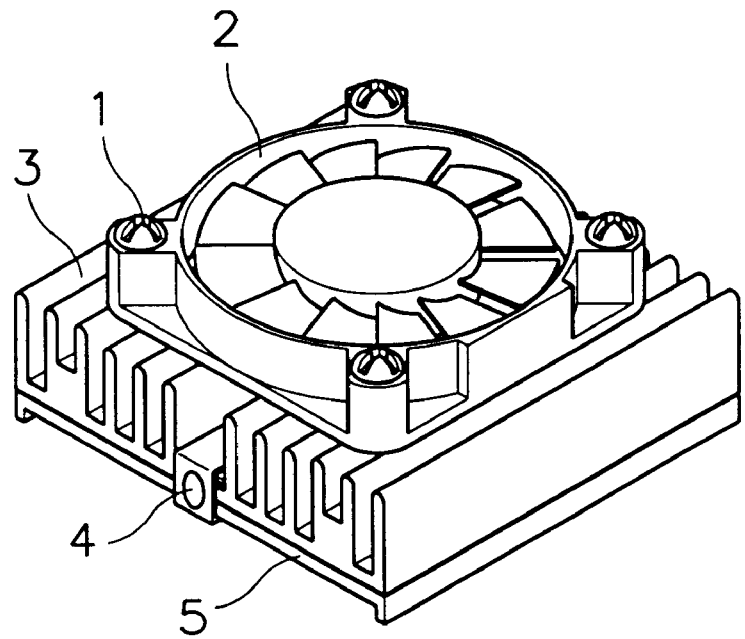
FIG. 2 is an assembled perspective view, which shows the construction of a conventional heat sink and a cooling fan of the micro-controller.
Figure 3:
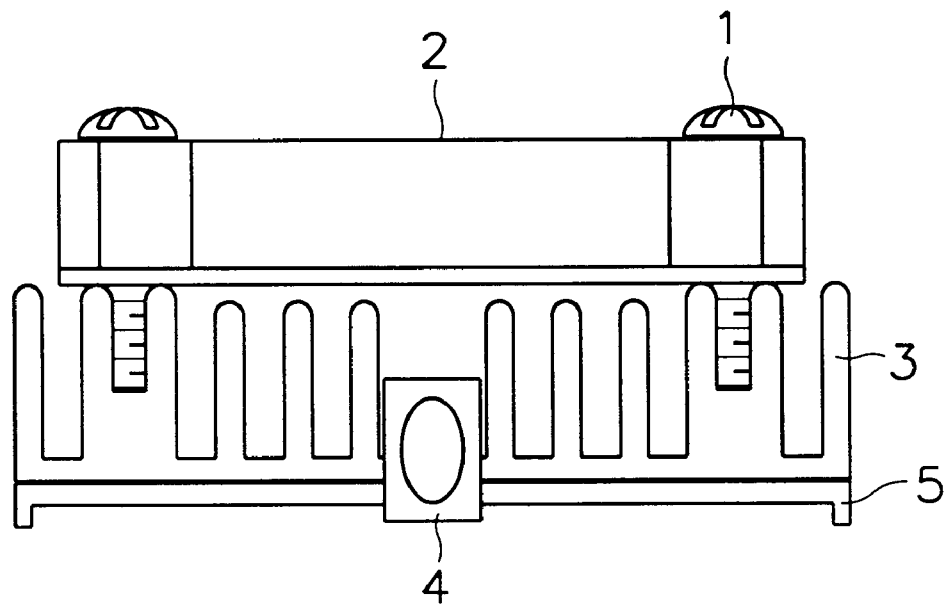
FIG. 3 is a side view, which shows the construction of a conventional heat sink and a cooling fan of the micro-controller.
Figure 4:
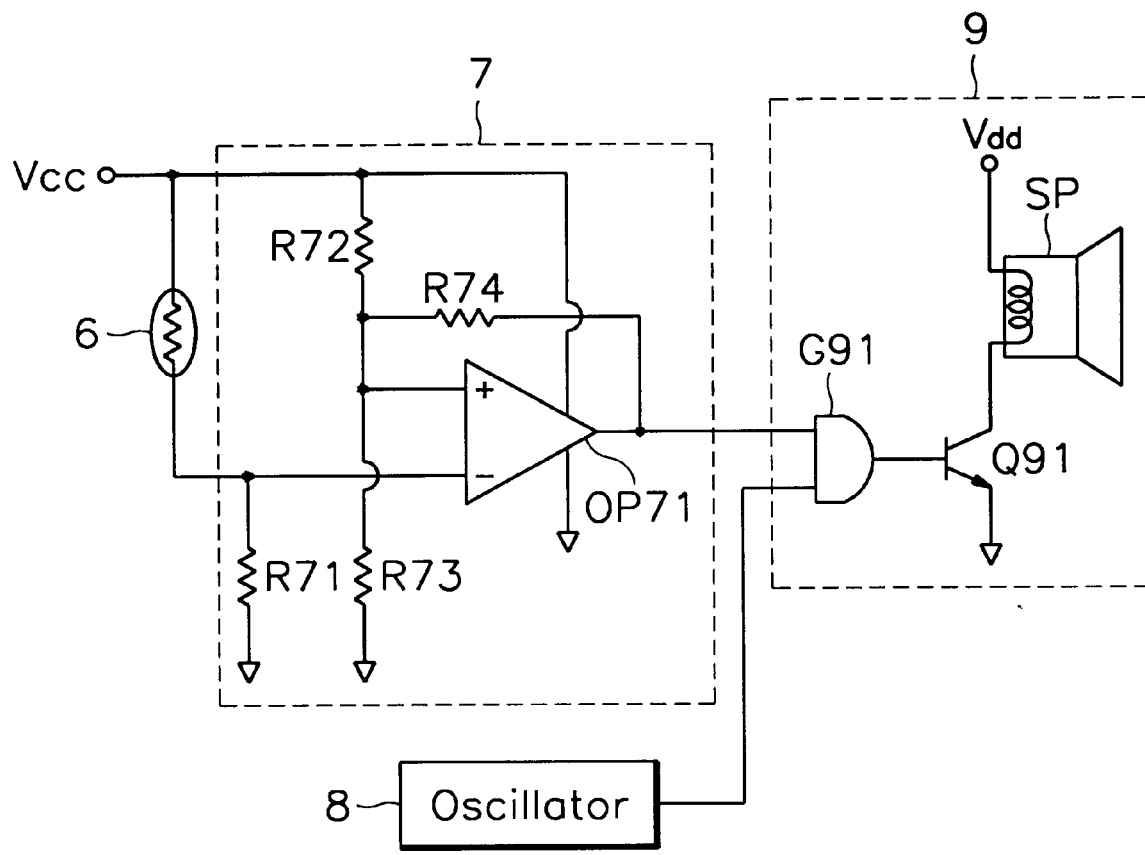
FIG. 4 is a detailed circuit diagram, which shows the overheat alarm of the micro-controller chip package in accordance with a first preferred embodiment of the invention.

FIG. 4 is a detailed circuit diagram, which shows an overheat alarm of the micro-controller chip in accordance with a first preferred embodiment of the present invention. As illustrated in FIG. 4, the overheat alarm of the micro-controller chip comprises a temperature sensor (6) which is mounted on the side of the heat sink (not shown), a voltage comparator (7) which has one of its input terminals connected to the output terminal of the temperature sensor (6), an oscillator (8), and an alarm sound generator (9) having its input terminals connected to the output terminal of the voltage comparator (7) and the oscillator (8).

The temperature sensor (6) includes a thermistor having a resistance that varies according to the surrounding temperature.

The voltage comparator (7) includes a resistor (R71) which is connected between the temperature sensor (6) and ground, resistors (R72, R73) which are connected in series between the power voltage (Vcc) and ground, an operating amplifier (OP71) having an inverting input terminal connected to the junction of the temperature sensor and the resistor (R71) and a non-inverting input terminal connected to the junction between resistors (R72, R73) and a resistor (R74) which is connected between the non-inverting input terminal and the output terminal of the operating amplifier (OP71).

The alarm sound generator (9) includes an AND gate (G91) having one input terminal connected to the output terminal of the voltage comparator (7) and another input terminal connected to the oscillator (8), a transistor (Q91) having a base terminal connected to the output terminal of the AND gate and having an emitter terminal which is grounded, and a speaker (SP) which is connected between a collector terminal of the transistor (Q91) and a power voltage (Vdd).

Figure 5:
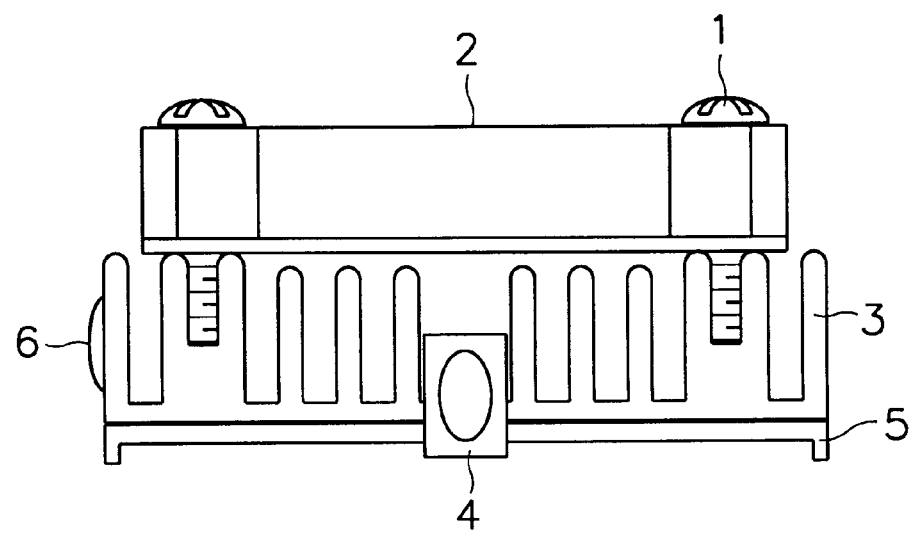
FIG. 5 is a side view, which shows the construction of the heat sink and cooling fan of the microcontroller of the present invention.

FIG. 5 is an assembled view, which shows the temperature sensor (6) mounted on the overheat alarm of the micro-controller chip in accordance with the first preferred embodiment of the present invention.

As illustrated in FIG. 5, the temperature sensor (6) on the overheat alarm of the micro-controller chip in accordance with the first preferred embodiment of the invention includes a thermistor mounted in the side of the heat sink (3). Elements having similar functions are labelled with the same reference numerals throughout the figures.

Operation of the overheat alarm of the micro-controller chip in accordance with the first preferred embodiment of the present invention will be described hereinafter.

Once power is applied, the computer system begins working and heat is generated by the micro-controller chip package (5). Some heat is dissipated into the air and a large amount of heat is transmitted to the heat sink (3). As in the above description, the heat transmitted to the heat sink (3) lowers the temperature by transmitting the heat to the atmosphere through the surrounding air with the help of the cooling fan. In this case, the temperature sensor (6) works in such a way that its resistance changes according to the temperature of the heat sink (3). If the temperature goes up, the resistance of the temperature sensor drops, and causes a high-voltage to be applied across the resistor (R71) of the voltage comparator (7). If the temperature of the heat sink (3) falls, the resistance of the temperature sensor goes up and causes a low-voltage to be applied across the resistor (R71) of the voltage comparator (7).

The operating amplifier (OP71) of the voltage comparator (7) compares the voltage input to the non-inverting input terminal (via temperature sensor (6)) with the reference voltage input to the inverting input terminal delivered by the resistors (R72, R73). If the voltage input to the inverting input terminal is above the reference voltage, i.e., when the temperature of the heat sink (3) is high enough, the comparator (7) outputs a high-voltage signal to the alarm sound generator (9). If the voltage input to the inverting input terminal is below the reference voltage, i.e., when the temperature of the heat sink (3) is relatively low, the comparator (7) outputs a low-voltage signal to the alarm sound generator (9).

When a high-voltage signal is input to the alarm sound generator (9) from the voltage comparator (7), the AND gate (G91) of the alarm sound generator is enabled and causes the oscillating signal input from the oscillator (8) to operate the transistor (Q91). However, when a low-voltage signal is input from the voltage comparator (7), the AND gate (G91) of the alarm sound generator (9) is disabled, so that the oscillating signal input from the oscillator (8) is not input to the transistor (Q91).

The transistor (Q91) of the alarm sound generator (9) outputs an alarm sound from the speaker (SP) by amplifying the input oscillating signal. A user can protect the micro-controller chip (5) from being damaged from overheating by stopping the power supplied to the computer system upon hearing the alarm sound generated by the speaker (SP).

As in the above description, an overheating alarm for the micro-controller chip can be provided. When the temperature of the micro-controller chip increases past a predetermined temperature, it generates an alarm, such as a loud sound, and prompts the user to stop using the computer and to protect the micro-controller chip from damage caused by overheating. The effect of this invention is usable in the design, manufacturing, and sale of the computer.

Figure 6:
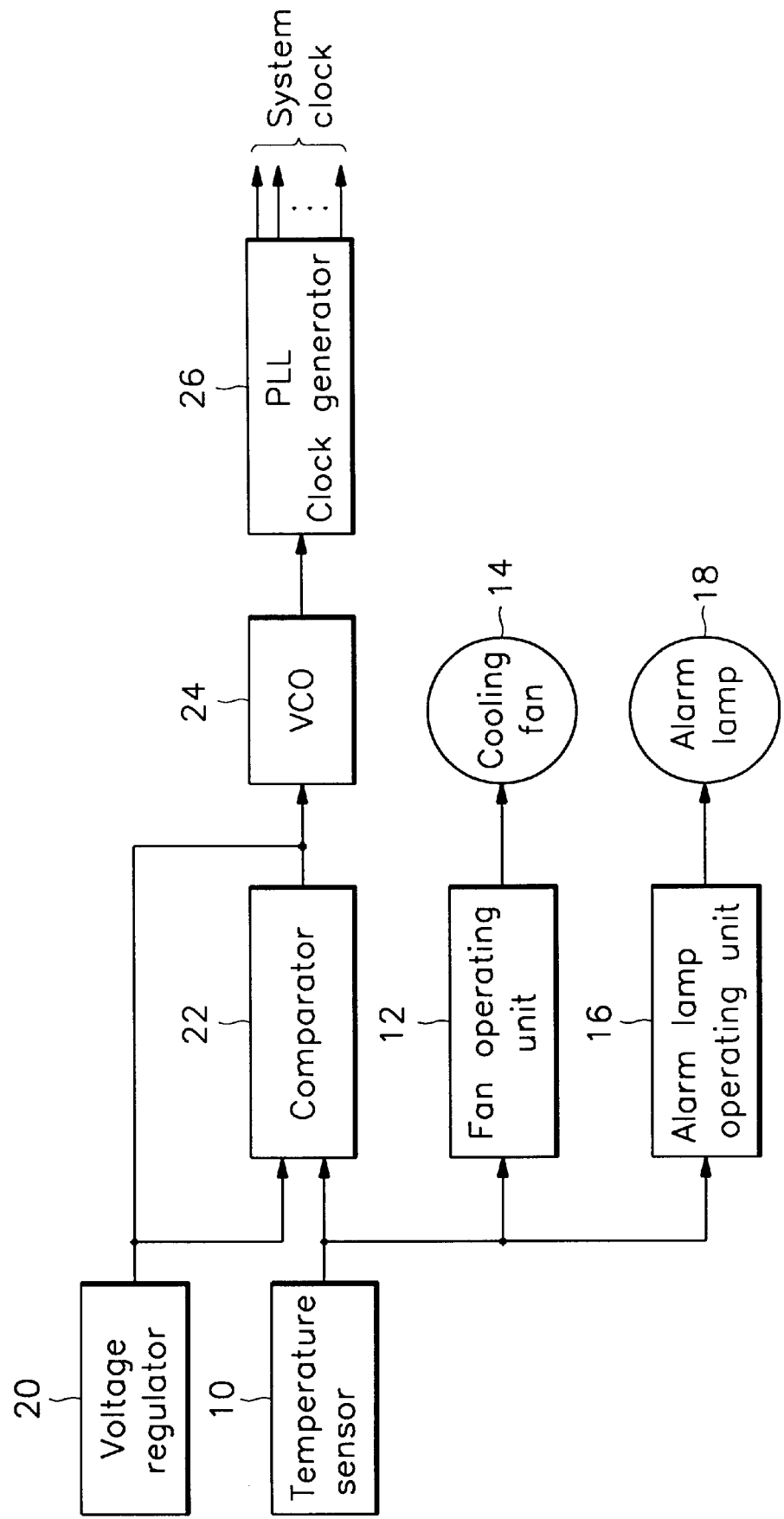
FIG. 6 shows the computer system protection device in accordance with the second preferred embodiment of the invention.

FIG. 6 shows the computer system protection device in accordance with the second preferred embodiment of the invention.

As illustrated in FIG. 6, the computer system protection device comprises a cooling fan (14), and a temperature sensor (10) which, upon sensing the internal temperature of the system, outputs a voltage proportional to the internal temperature of the system. A fan operating unit (12) controls the number of RPMs of the cooling fan in proportion to the output voltage of the temperature sensor (10). An alarm lamp (18) displays the computer's internal temperature or illuminates at that temperature to indicate that it is nearing the threshold temperature when it approaches an overheating condition. An alarm lamp operating unit (16) operates the alarm lamp (18) when the output voltage of the temperature sensor (10) is above a predetermined value. A voltage regulator (20) which generates a voltage based on a predetermined temperature. A voltage comparator (22) compares the output voltage of the temperature sensor (10) with the output voltage of the voltage regulator (20) and outputs a fixed voltage if the internal temperature of the system is below the predetermined temperature. The comparator (22) outputs a voltage in proportion to the temperature of the heat sink if the temperature of the heat sink is above a predetermined temperature. A voltage controlled oscillator (24) outputs a frequency proportional to the output voltage of the voltage comparator (22), and a clock generator (26) outputs a clock speed proportional to the output frequency of the voltage controlled oscillator (24).

Operation of the computer system protection device in accordance with the second preferred embodiment of the invention will be described.

Figure 7:
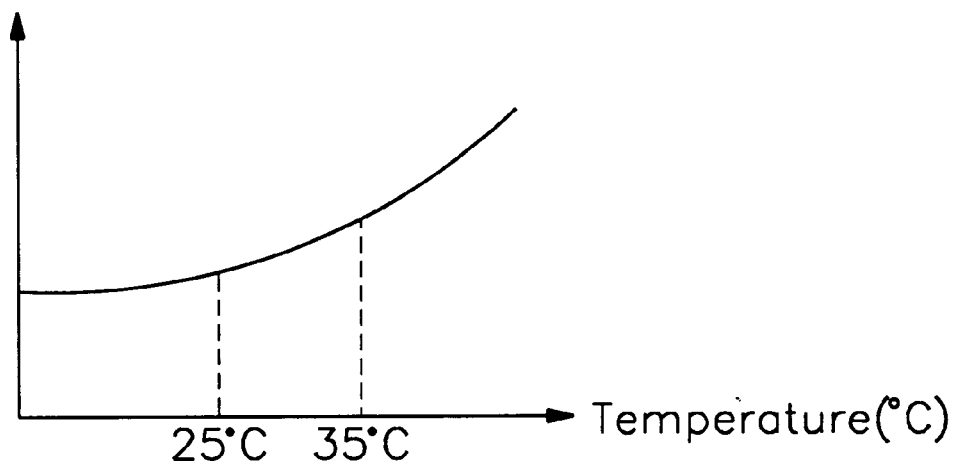
FIG. 7 shows the output voltage of the temperature sensor according to the temperature variation in the computer system protection device in accordance with the second preferred embodiment of the invention.

The temperature sensor (10), after sensing the internal temperature of the system, outputs a voltage proportional to the sensed temperature. The output voltage of the temperature sensor (10) varies in proportion to the temperature as illustrated in FIG. 7.

Figure 9:
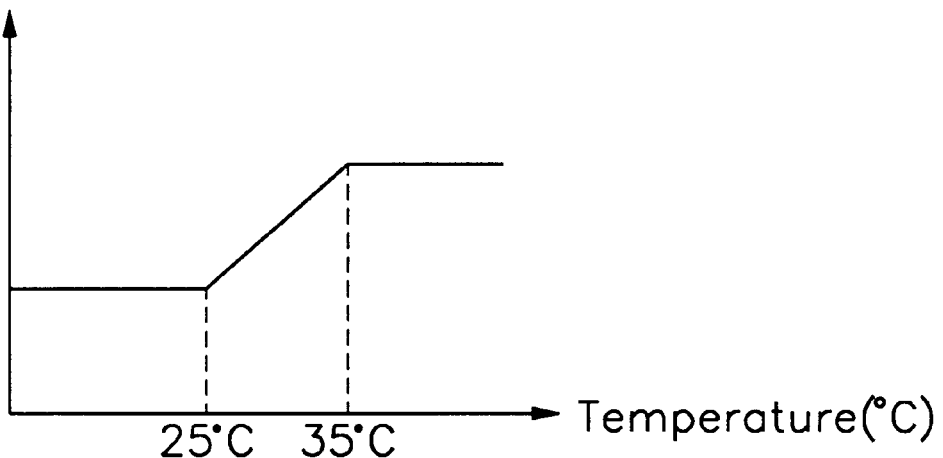
FIG. 9 shows the variation of the number of revolutions per minute (RPM) of the cooling fan in proportion to the temperature variation in the computer system protection device in accordance with the second preferred embodiment of the invention.

The fan operating unit (12) controls the RPMs of the cooling fan (14) in proportion to the output voltage of the temperature sensor (10). The RPMs of the cooling fan is shown in FIG. 9. If the internal temperature is below a predetermined temperature, preferably 25° C., the fan operating unit rotates the cooling fan (14) at a first number of RPMs, if the internal temperature is between a predetermined range, preferably between 25° C. and 35° C., it rotates the cooling fan (14) at RPMs in proportion to the internal temperature, and if the internal temperature is above a predetermined temperature, preferably 35° C., the fan operating unit will rotate the cooling fan at a constant maximum speed. An alarm lamp (18) displays the computer's internal temperature when the output from the temperature sensor (10) is above a predetermined value.

A voltage regulator (20) generates a voltage corresponding to a predetermined temperature (fixed at 35° C. in this preferred embodiment of the present invention) and applies it to both the reference voltage terminal and output terminal of the voltage comparator (22).

A voltage comparator (22) compares the output voltage of the temperature sensor (10) which is input through the voltage comparator's input terminal, with the output voltage of the voltage regulator (20) which is input through the voltage comparator's reference voltage terminal, and outputs a voltage corresponding to the difference in value. If the output voltage of the temperature sensor (10) is lower than that of the voltage regulator (20), that is, in case where the internal temperature of the computer system is below 35° C., the voltage regulator (20) forces the output voltage of the voltage comparator (22) to a fixed voltage as illustrated in FIG. 8.

Figure 8:
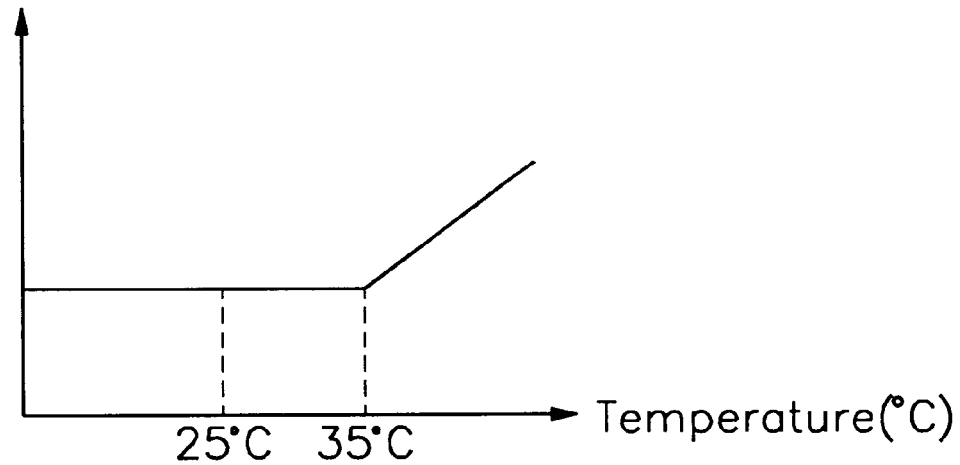
FIG. 8 shows the output voltage of the voltage comparator according to the temperature variation in the computer system protection device in accordance with the second preferred embodiment of the invention.

When the output voltage of the temperature sensor (10) is higher than that of the voltage regulator (20), that is, if the internal temperature of the computer system is above 35° C., the output voltage of the voltage comparator (22) increases in proportion to the internal temperature sensed at the temperature sensor (10) as illustrated in FIG. 8.

Figure 10:
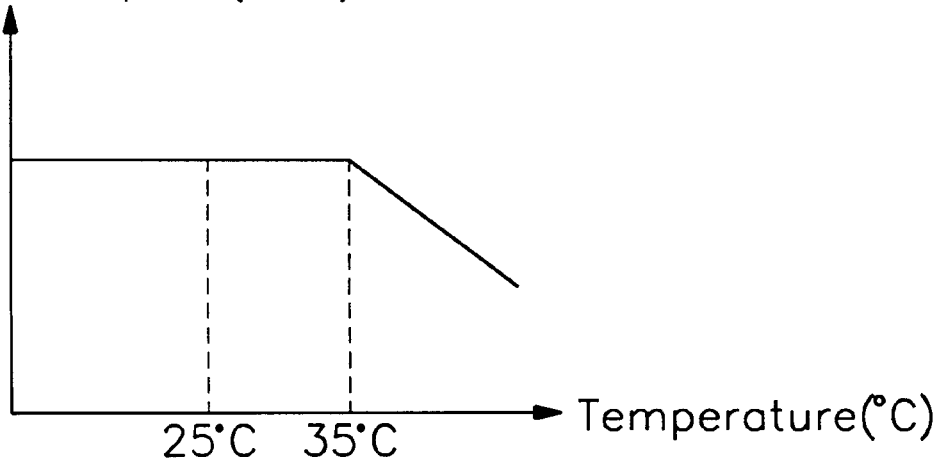
FIG. 10 shows the variation of the system clock speed according to the temperature variation in the computer system protection device in accordance with the second preferred embodiment of the invention.

A voltage controlled oscillator (24) outputs a frequency in proportion to the output voltage of the voltage comparator (22). If the internal temperature of the computer system is below 35° C., it outputs a pre-set fixed frequency, and if it is above 35° C., it outputs the signal having a varied frequency proportional to the temperature of the heat sink to the PLL (Phase Locked Loop) clock generator (26). The PLL clock generator (26) outputs a system clock signal having a clock speed varying as illustrated in FIG. 10 on the basis of the signal frequency input from the voltage controlled oscillator (24). That is if the internal temperature of system is below 35° C., it outputs-the system clock having a first fixed clock speed, and if it is above 35° C., it outputs the system clock having a speed that decreases in proportion to the increase in temperature as shown in FIG. 10.

As described above, in this second embodiment of the invention, a computer system protection device is provided that controls the speed of the cooling fan in proportion to the temperature if the internal temperature of the system is between a range of predetermined temperatures. This embodiment also reduces the heat generated by decreasing the system clock speed, thereby cooling the system if its temperature is above the predetermined temperature in order to protect the computer system at high temperatures.

The present invention can protect the computer system from losing data through faults caused by overheating by preventing the system from shutting down at high temperatures.

It thus will be seen that the objects of this invention have been fully and effectively accomplished. It will be realized, however, that the foregoing preferred specific embodiments have been shown and described for the purpose of illustrating the functional and structural principles of this invention and is subject to change without departure from such principles. Therefore, this invention includes all modifications encompassed within the spirit and scope of the following claims.

What is claimed is:

1. A protection device for a micro-controller chip package comprising:

a heat sink adapted to be mounted on the micro-controller chip package and having a plurality of surfaces for dissipating heat generated by the micro-controller chip package;

a cooling fan assembly adapted to be mounted on said heat sink assembly for dispersing the heat dissipated by the heat sink into the surrounding atmosphere;

a temperature sensor for converting a temperature of the heat sink into electrical signals and for outputting a voltage proportional to the temperature of the heat sink, said temperature sensor adapted to be placed on one of said surfaces of the heat sink assembly;

a voltage comparator for comparing the voltage output from the temperature sensor with a reference voltage signal and outputting a comparator output voltage; and an alarm enabled by the comparator output voltage from the voltage comparator for generating an alarm signal.

2. A protection device as in claim 1, wherein said temperature sensor includes a thermistor having a resistance which varies proportionally with the temperature of the micro-controller chip.

3. A protection device as in claim 1, wherein said voltage comparator includes:

an operating amplifier having an inverting input terminal connected to said temperature sensor, a non-inverting input terminal, and an output terminal;

a first resistor connected between the inverting input terminal and a ground reference potential;

a second resistor connected between a power voltage reference potential and the non-inverting terminal of the operating amplifier;

a third resistor connected between the non-inverting terminal of the operating amplifier and the ground reference potential;

wherein the operating amplifier compares the output voltage from the temperature sensor with the voltage across the third resistor, and outputs a voltage result to the output terminal; and a fourth resistor which is connected between a non-inverting input terminal and the output terminal of the operating amplifier.

4. A protection device as in claim 1, wherein said alarm comprises:

an oscillator which generates and outputs an oscillating voltage signal;

an AND gate having a first input terminal connected to an output terminal of the voltage comparator and a second input terminal connected to an output of the oscillator;

a transistor having a base terminal connected to an output terminal of the AND gate and having an emitter terminal connected to a ground reference potential; and a speaker connected between a collector terminal of the transistor and a power reference voltage.

5. A computer system protective device, which comprises:

a cooling fan for lowering an internal temperature of the system;

a temperature sensor which senses the internal temperature of the computer system and converts the sensed internal temperature into a reference voltage, said temperature sensor outputting the reference voltage to an output terminal;

a fan operating unit which controls a rotation speed of the cooling fan as a function of the reference voltage output by the temperature sensor;

a voltage regulator which generates an output voltage corresponding to a predetermined temperature;

a voltage comparator which compares the reference voltage of the temperature sensor with the output voltage of the voltage regulator and outputs a fixed comparator output voltage if the internal temperature of the computer system is below the predetermined temperature, and outputs a comparator output voltage which is proportional to the internal temperature of the computer system if the internal temperature of the computer system is above the predetermined temperature;

a voltage controlled oscillator which outputs a frequency proportional to the comparator output voltage to a system clock generator which outputs a system clock signal having a frequency proportional to the output frequency of the voltage controlled oscillator.

6. A computer system protection device as in claim 5, further comprising:

an alarm which outputs an alarm signal when the internal temperature nears said predetermined temperature.

7. A computer system protection device as in claim 6, wherein the predetermined temperature is about 35° C.

8. A computer system protection device as in claim 7, wherein:

said fan operating unit rotates the cooling fan at a first rotating speed if the internal temperature is below about 25° C.;

said fan operating unit rotates the cooling fan at a speed in proportion to the internal temperature of the computer system if the internal temperature of the computer system is between about 25° C. and 35° C.; and said fan operating unit rotates the cooling fan at a constant second rotating speed if the internal temperature of the computer system is above about 35° C.

9. A computer system protection device as in claim 5, wherein said frequency of said system clock signal is inversely proportional to the output frequency of the voltage controlled oscillator.

10. A computer system protection device for a micro-controller chip package comprising:

a heat sink assembly adapted to be mounted on the micro-controller chip package, said heat sink assembly having a plurality of surfaces for dissipating heat generated by said micro-controller chip package;

a cooling fan assembly adapted to be mounted on said heat sink assembly for dispersing heat dissipated by the heat sink assembly into the surrounding atmosphere;

a temperature sensor for converting a temperature of the heat sink into electrical signals and for outputting a voltage proportional to the temperature of the heat sink assembly, the temperature sensor adapted to be placed on one of said surfaces of the heat sink assembly;

a voltage comparator for comparing the voltage output from the temperature sensor with a reference voltage signal and outputting a comparator output voltage; and a fan operating means which controls a rotation speed of the cooling fan as a function of the reference voltage output by the temperature sensor.

11. A computer system protection device as in claim 10, further comprising:

alarming means which outputs an alarm signal when the temperature nears a predetermined temperature.

12. A computer system protection device for a micro-controller chip package comprising:

a heat sink assembly adapted to be mounted on the micro-controller chip package, said heat sink assembly having a plurality of surfaces for dissipating heat generated by said micro-controller chip package;

a cooling fan assembly adapted to be mounted on said heat sink assembly for dispersing heat dissipated by the heat sink assembly into the surrounding atmosphere;

a temperature sensor for converting a temperature of the heat sink into electrical signals and for outputting a voltage proportional to the temperature of the heat sink assembly, the temperature sensor adapted to be placed on one of said surfaces of the heat sink assembly;

a voltage comparator for comparing the voltage output from the temperature sensor with a reference voltage signal and outputting a comparator output voltage; and a voltage controlled oscillator which outputs a frequency proportional to the comparator output voltage to a system clock generator which outputs a system clock signal having a frequency proportional to the output frequency of the voltage controlled oscillator.

13. A computer system protection device as in claim 12, further comprising:

alarming means which outputs an alarm signal when the temperature nears a predetermined temperature.

* * * * *